(12) United States Patent
Wildenberg et al.

(10) Patent No.: US 9,811,006 B2
(45) Date of Patent: Nov. 7, 2017

(54) METHOD OF DETERMINING A MEASUREMENT SUBSET OF METROLOGY POINTS ON A SUBSTRATE, ASSOCIATED APPARATUS AND COMPUTER PROGRAM

(71) Applicant: ASML Netherlands B.V., Veldhoven (NL)

(72) Inventors: Jochem Sebastiaan Wildenberg, Aarle-Rixtel (NL); Everhardus Cornelis Mos, Best (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/111,763

(22) PCT Filed: Nov. 4, 2014

(86) PCT No.: PCT/EP2014/073645
§ 371 (c)(1),
(2) Date: Jul. 14, 2016

(87) PCT Pub. No.: WO2015/110191
PCT Pub. Date: Jul. 30, 2015

(65) Prior Publication Data
US 2016/0334717 A1 Nov. 17, 2016

(30) Foreign Application Priority Data
Jan. 24, 2014 (EP) .................................... 14152423

(51) Int. Cl.
*G01B 11/00* (2006.01)
*G03B 27/32* (2006.01)
(Continued)

(52) U.S. Cl.
CPC ........ *G03F 7/70775* (2013.01); *G01B 11/272* (2013.01); *G03F 7/70625* (2013.01);
(Continued)

(58) Field of Classification Search
CPC ............... G01B 11/272; G03F 7/70616; G03F 7/70625; G03F 7/70633; G03F 7/70683;
(Continued)

(56) References Cited

U.S. PATENT DOCUMENTS

| 7,330,800 B1 | 2/2008 | Good et al. |
| 2003/0223630 A1* | 12/2003 | Adel ........................ G03F 7/705 382/145 |

(Continued)

OTHER PUBLICATIONS

International Search Report and Written Opinion dated Feb. 11, 2015 in corresponding International Patent Application No. PCT/EP2014/073645.

(Continued)

*Primary Examiner* — Colin Kreutzer
(74) *Attorney, Agent, or Firm* — Pillsbury Winthrop Shaw Pittman LLP

(57) ABSTRACT

A method of determining a measurement subset of metrology point locations which includes a subset of potential metrology point locations on a substrate. The method including identifying a plurality of candidate metrology point locations from the potential metrology point locations. A change in the level of informativity imparted by the measurement subset of metrology point locations which is attributable to the inclusion of that candidate metrology point location into the measurement subset of metrology point locations is evaluated for each of the candidate metrology point locations. The candidate metrology point locations which have the greatest increase in the level of informativity attributed thereto are selected for inclusion into the measurement subset of metrology point locations.

20 Claims, 7 Drawing Sheets

(51) Int. Cl.
*G03B 27/68* (2006.01)
*G03F 7/20* (2006.01)
*G03F 9/00* (2006.01)
*G01B 11/27* (2006.01)

(52) U.S. Cl.
CPC ...... *G03F 7/70633* (2013.01); *G03F 7/70683* (2013.01); *G03F 9/7003* (2013.01); *G03F 9/7046* (2013.01)

(58) Field of Classification Search
CPC ... G03F 7/70775; G03F 9/7003; G03F 9/7046
USPC .................. 355/52, 55, 77; 356/399–401
See application file for complete search history.

(56) References Cited

U.S. PATENT DOCUMENTS

| | | | |
|---|---|---|---|
| 2005/0025352 A1* | 2/2005 | Suzuki | G06T 7/70 382/151 |
| 2005/0254030 A1* | 11/2005 | Tolsma | G03F 9/7046 355/53 |
| 2006/0074611 A1 | 4/2006 | Wong et al. | |
| 2006/0190207 A1 | 8/2006 | Whitefield et al. | |
| 2008/0147343 A1 | 6/2008 | Good et al. | |
| 2008/0147374 A1 | 6/2008 | Chan et al. | |
| 2008/0148194 A1 | 6/2008 | Chan et al. | |
| 2008/0148195 A1 | 6/2008 | Chan et al. | |
| 2008/0148216 A1 | 6/2008 | Chan et al. | |
| 2008/0201117 A1 | 8/2008 | Wong et al. | |
| 2008/0228435 A1 | 9/2008 | Lee et al. | |
| 2011/0170091 A1 | 7/2011 | Chang et al. | |
| 2011/0202298 A1 | 8/2011 | Izikson et al. | |
| 2012/0084041 A1 | 4/2012 | Izikson et al. | |
| 2012/0218533 A1 | 8/2012 | Lyulina et al. | |
| 2013/0035888 A1* | 2/2013 | Kandel | G03F 7/70633 702/81 |
| 2015/0025846 A1* | 1/2015 | Klein | G03F 7/70633 702/179 |

OTHER PUBLICATIONS

Ran Jin et al., "Sequential Measurement Strategy for Wafer Geometric Profile Estimation," Institute of Industrial Engineers Transactions, vol. 44, No. 1 (Dec. 2011).

Chun-Yen Huang et al., "Overlay Improvement by Zone Alignment Strategy," Proc. of SPIE, vol. 6922, pp. 69221G-1-69221G-8 (2008).

* cited by examiner

METHOD OF DETERMINING A MEASUREMENT SUBSET OF METROLOGY POINTS ON A SUBSTRATE, ASSOCIATED APPARATUS AND COMPUTER PROGRAM

This application is the U.S. national phase entry of PCT patent application no. PCT/EP2014/073645, which was filed on Nov. 4, 2014, which claims the benefit of priority of EP patent application no. 14152423.1, which was filed on Jan. 24, 2014, and which is incorporated herein in its entirety by reference.

FIELD

The present invention relates to a method of determining a measurement subset of metrology points on a substrate, an associated apparatus and a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Whichever type of apparatus is employed, the accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. These operations, being time-consuming, limit the throughput of the lithography apparatus, and consequently increase the unit cost of the semiconductor or other products.

As pattern features become smaller and overlay performance requirements become ever more demanding, so-called advanced alignment models have been and continue to be developed to model and correct more accurately non-linear distortions of the "wafer grid".

These advanced models depend on measuring an increased number of targets across the substrate. Ultimately, however only a limited number of the available targets can be measured without unduly limiting the throughput of the lithographic process as a whole.

SUMMARY

It is desirable therefore to increase the reliability of said alignment models, or other metrology processes, without decreasing throughput by increasing the number of measurements.

In one aspect, the invention provides a method of determining a measurement subset of metrology point locations, said measurement subset comprising a subset of potential metrology point locations on a substrate; wherein said method comprises: identifying a plurality of candidate metrology point locations from said potential metrology point locations; evaluating for each of said candidate metrology point locations, a change in the level of informativity imparted by said measurement subset of metrology point locations which is attributable to the inclusion of that candidate metrology point location into said measurement subset of metrology point locations; and selecting for inclusion into said measurement subset of metrology point locations, those candidate metrology point locations which have the greatest increase in the level of informativity attributed thereto.

These and other features and advantages of particular embodiments of the invention will be understood by the skilled reader from a consideration of the exemplary embodiments discussed below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Figure 1:
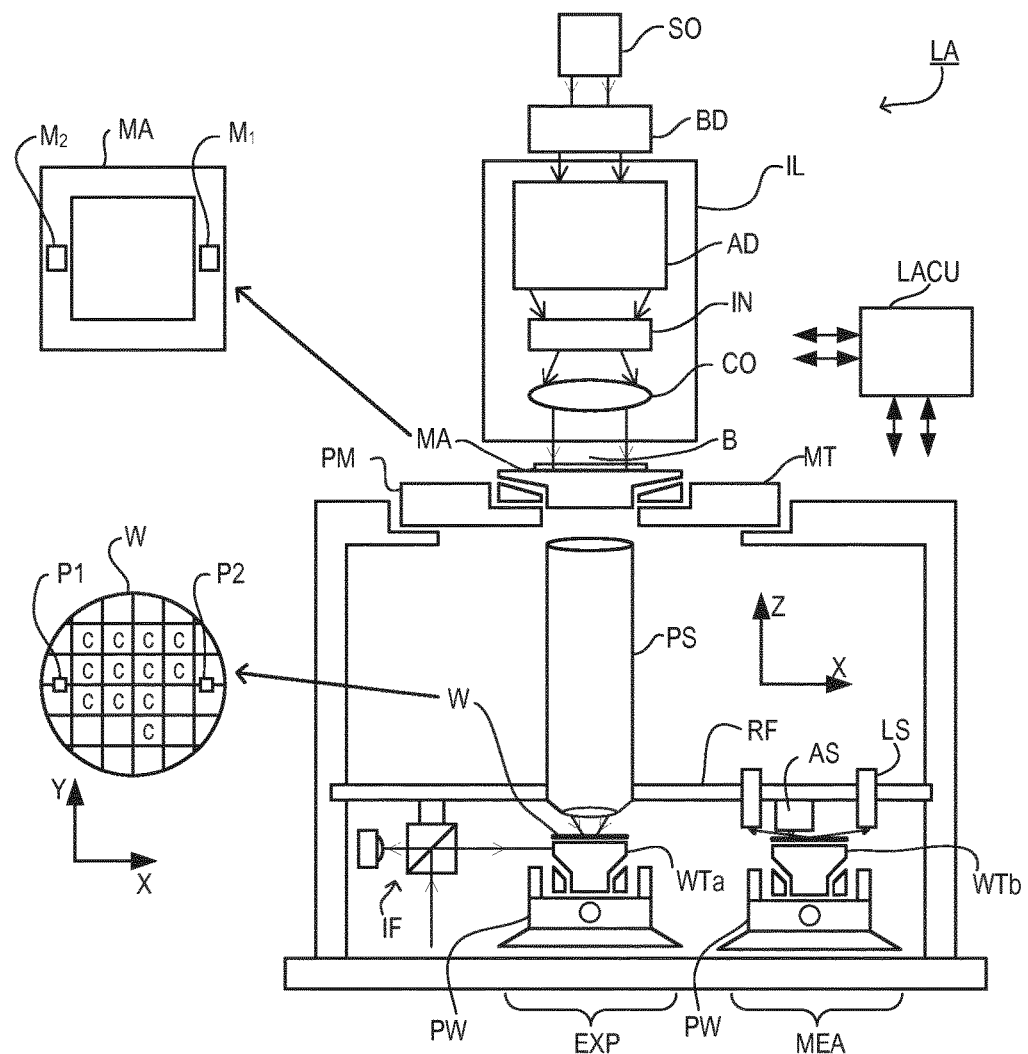
FIG. 1 depicts a lithographic apparatus according to an embodiment of the invention.

FIG. 1 schematically depicts a lithographic apparatus LA according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface of the substrate using a level sensor LS and measuring the position of alignment mark on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. The invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
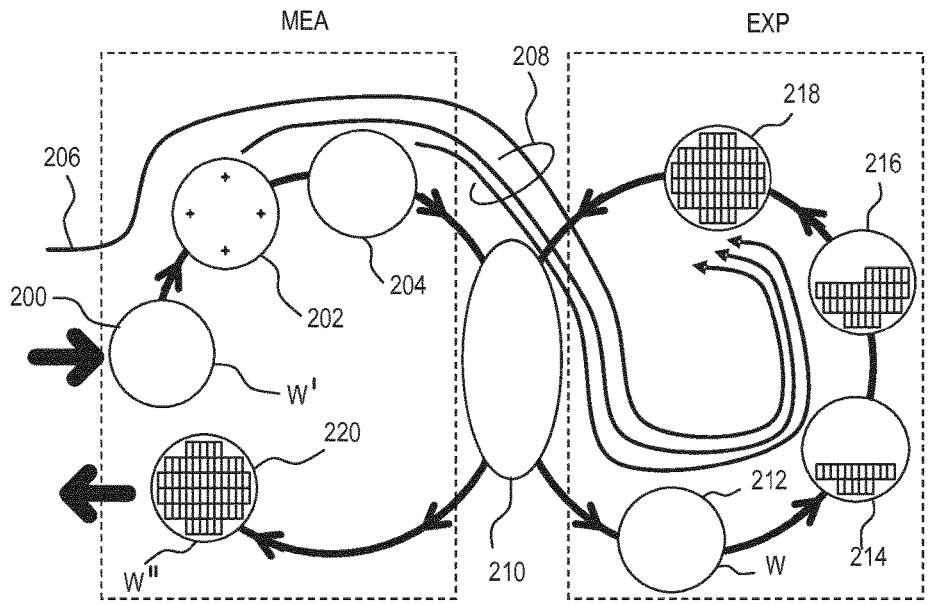
FIG. 2 illustrates schematically the stages in the measurement and exposure processes in the apparatus of FIG. 1, according to known practice.

FIG. 2 illustrates the known steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured, to establish a "wafer grid", which maps very accurately the distribution of marks across the substrate, including any distortion relative to a nominal rectangular grid. At step 204, a map of substrate height against X-Y position is measured also, for use in accurate focusing of the exposed pattern.

When substrate W' was loaded, recipe data 206 were received, defining the exposures to be performed, and also properties of the substrate and the patterns previously made and to be made upon it. To these recipe data are added the measurements of substrate position, substrate grid and height map that were made at 202, 204, so that a complete set of recipe and measurement data 208 can be passed to the exposure stage. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further below, advanced models are known that use more parameters.

At 210, substrates W' and W are swapped, so that the measured substrate W' becomes the substrate W entering the exposure station EXP. This swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Advanced Alignment Models

Current standard alignment models may comprise six parameters (effectively three per direction X and three per direction Y). This may be adequate for some applications, but for more demanding processes a more detailed correction of the wafer grid may be required to achieve a desired overlay performance. Advanced alignment models have been developed for this purpose. In this text, the term "advanced alignment models" is used to refer to models having greater complexity than the standard six parameters. While simpler models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models. HOWA is a published technique based on third and higher order polynomial functions. Zone alignment is described for example in Huang et al, "Overlay improvement by zone alignment strategy", Proc. SPIE 6922, 69221G (2008). Different versions and extensions of these advanced models can be devised. The advanced models generate a complex description of the wafer grid that is corrected for, during the exposure of the target layer. RBF and latest versions of HOWA provide particularly complex descriptions based on tens of parameters. This implies a great many measurements are required to obtain a wafer grid with sufficient detail.

Even in embodiments with multiple substrate tables WTa/WTb, the time taken to obtain sufficient measurements for advanced alignment on each substrate eventually impacts throughput. Reducing the time per measurement tends to decrease the accuracy of each measurement, so that the impact on throughput is hard to avoid. In addition, once corrections have been applied in one layer using an advanced alignment model, the same level of detail should be applied in subsequent layers, or the corrections in the first layer become a source of error in the overlay of subsequent layers. The manufacturer therefore has a difficult choice whether to accept further measurement overhead by using the advanced model in subsequent layers, or to suffer an overlay penalty by reverting to a simpler alignment model in subsequent layers, measuring fewer marks.

There is a large degree of similarity in the problems faced for alignment and model estimation/correction calculation. The commonality is that a certain systematic pattern is estimated using a limited set of measurements taken at certain locations. The positions from which measurements are selected for inclusion in the estimation process, determines how reliable the resulting model is. This is because not all measurement positions are necessarily equally informative for the estimation procedure.

Current customer high volume manufacturing (HVM) measurement schemes typically sample four to eight fields on the substrate densely while covering the rest of the substrate in a sparse fashion (e.g. one metrology point per field). This is already suboptimal for the models currently in use, and more serious problems begin to occur for higher order models.

In a lithographic apparatus such as shown in FIG. 1, alignment is performed for each substrate prior to exposure. Multiple metrology points (e.g., alignment marks) are used to capture the shape of the substrate and to average out placement noise (e.g., originating from the lithographic apparatus baseline). Typically a subset of metrology point locations are selected for sampling from a number of possible metrology point locations on a substrate, the subset of metrology point locations comprising far fewer locations compared to the number of possible metrology point locations. Current algorithms for alignment determine which metrology point locations are selected for sampling based on covering the substrate in a uniform fashion, uniformity being defined as being equal distances between neighboring metrology points.

Methods for determining the metrology point locations on the substrate from which to include measurements in the estimation process are suboptimal in that they do not take into account informativity. The set of basis functions for models in use are typically a function of coordinates on the substrate (substrate and/or field and/or field center). If proper care is not taken as to which metrology point locations are considered, an excessive amount of noise might enter the model. Under the influence of noise, the estimated values might vary by an amount greater than the noise level. In other words, noise may actually be amplified by the modeling process. Higher order models are more prone to this effect than lower order models, while the general tendency is towards using higher order models in order to allow higher order (i.e. more refined) corrections. It is therefore proposed that care should be taken to select the most informative measurement locations for a given model.

Figure 3:
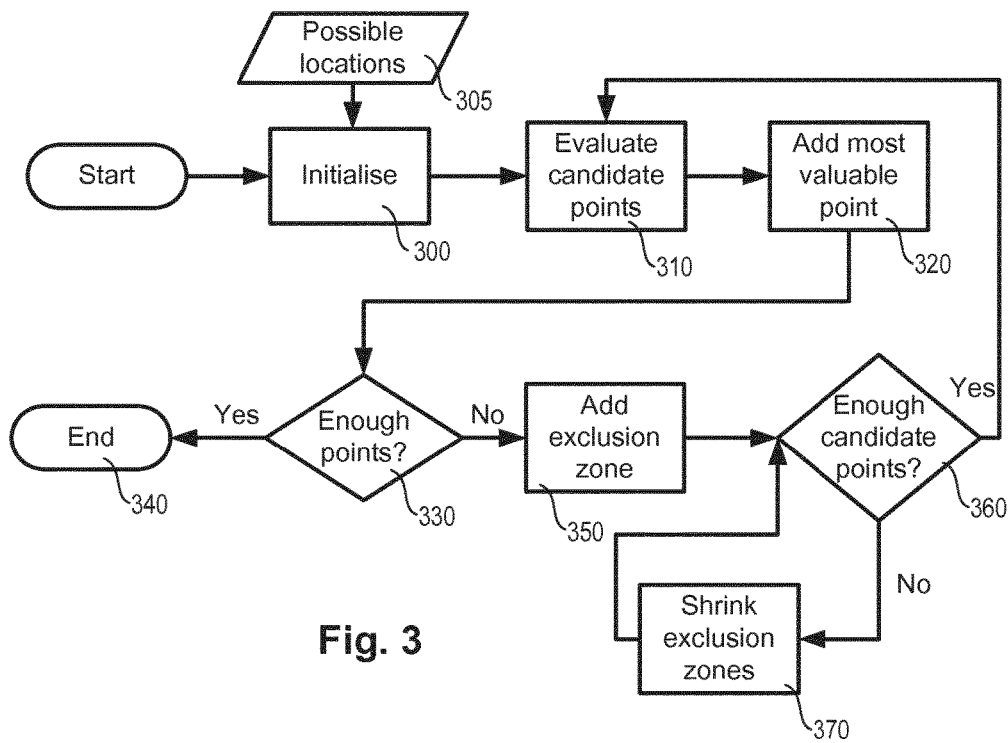
FIG. 3 is a flowchart illustrating a method according to an embodiment of the invention.

FIG. 3 is a flowchart describing a measurement scheme optimization algorithm which selects metrology point locations which are the most informative to the estimation process, given a certain model. At the same time the measurement scheme optimization algorithm attempts to position selected metrology point locations in a uniform way, such that the two objectives are balanced.

The algorithm is very fast, taking typically 0.7 seconds to optimize an alignment layout (32 selected metrology point locations out of 180) and 5 seconds for a more dense measurement scheme (200 selected metrology point locations out of 3000). The difference between current methods and this method can lead to an improvement of several nanometers in the estimated fingerprints (and hence corrections).

The measurement scheme optimization algorithm is input with a list of potential metrology point locations 305. The list of potential metrology point locations 305 may originate from one or more different sources. For example, the list 305 may originate from existing measurement data, where all available metrology point locations are measured. Alternatively, the list 305 may originate from a list of possible locations on a reticle, the possible locations comprising those where a metrology target can be inserted according to the reticle design. Accordingly the list of potential metrology point locations 305 may comprise locations where a metrology point already exists, and/or where there is no metrology point, but only the potential to locate one there.

Figure 4:
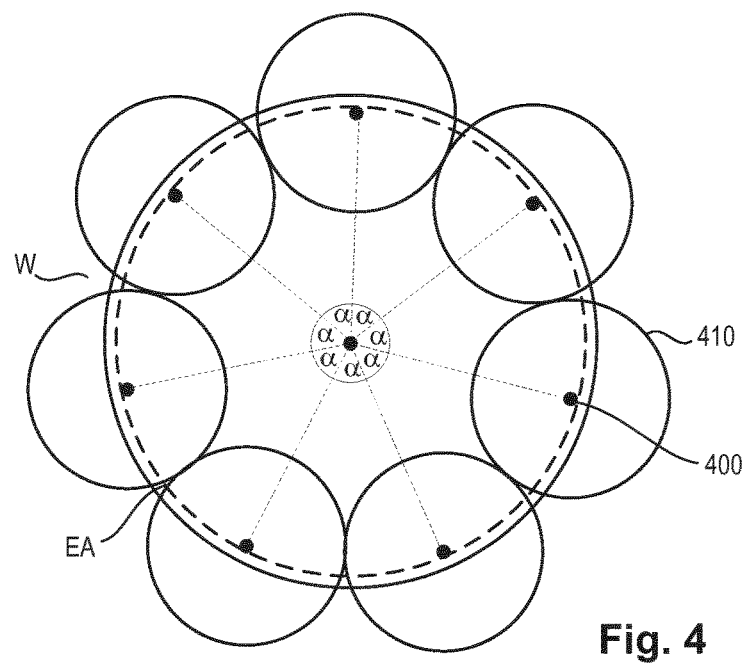
FIG. 4 is a representation of a substrate following an initialization step of the method illustrated in FIG. 3, according to an embodiment.

The first step of the flowchart is to initialize the measurement scheme 300. This step is illustrated in FIG. 4. The step comprises selecting a small number of initial selected metrology point locations 400 for the measurement scheme. These initial selected metrology point locations should be selected according to one or more criteria in accordance with the substrate alignment model. In an embodiment, each these selected metrology point locations may be selected metrology point locations 400 positioned at the edge of the effective area EA of substrate W, and separated equi-angularly (by angle α). The rationale for beginning with metrology point locations at the outer periphery is that these metrology point locations tend to have a good signal to noise ratio. The initialization step 300 also includes defining an exclusion zone 410 around each selected metrology point location 400. All metrology point locations which are outside the exclusion zones 410 are candidate metrology point locations; i.e. "selectable" in future iterations. The exclusion zones 410 may be circular and centered on each selected metrology point location 400, i.e., all metrology point locations within a certain distance of a selected metrology point location 400 may be within an exclusion zone 410.

The initial exclusion zones 410 should be relatively large as this will result in a more uniform distribution of metrology point location selected for the measurement scheme. In this example, each exclusion zone has a diameter approximately equal to the separation distance (along the perimeter) of pairs of initial selected metrology point locations 400. In one embodiment, the initial exclusion zones 410 may be of a predetermined size, for example they may have a radius between 20 mm and 200 mm, or between 50 mm and 150 mm, or more specifically, in the region of 100 mm Other sizes for the initial exclusion zones 410, or methods of determining these sizes, are conceivable and are within the scope of this disclosure.

The next step 310 is to evaluate all candidate metrology point locations, that is all non-selected metrology point locations which are not within an exclusion zone. For each candidate metrology point location, it is calculated how much the informativity of the measurement scheme would improve if that metrology point location were selected. The size of the initial exclusion zones 410 should have been chosen to ensure that the initial set of candidate metrology point locations is not too large. The number of candidate metrology point locations should be a compromise between uniformity, informativity (e.g. D-optimality) of the final measurement scheme, and speed of the algorithm.

After evaluating all candidate metrology point locations, the metrology point location which, according to the evaluation, contributes the most information to the measurement scheme is then added (step 320) to the measurement scheme. At step 330, it is determined whether the measurement scheme comprises sufficient selected metrology point locations. If it does, the algorithm ends 340. If the measurement scheme does not have sufficient selected metrology point locations then, at step 350, an exclusion zone is added around the newly selected metrology point location (the other selected metrology point locations will also have exclusion zones).

At step 360, it is determined whether there are a sufficient number of candidate metrology point locations remaining for the algorithm to select from, while maintaining the proper balance between informativity and uniformity. In an embodiment, if it is determined that there are too few candidate metrology point locations, this may be addressed at step 370 by shrinking the exclusion zones 410. The exclusion zones may be shrunk for all of the selected metrology point locations comprised in the measurement scheme at that time, or for only a subset of these selected metrology point locations. It may be decided to only shrink some of the exclusion zones depending on various criteria. Such criteria may comprise the size of the exclusion zone or its position. The shrinking of the exclusion zones may be by a predetermined amount or by a predetermined percentage.

Following step 370, the determination step 360 and (if necessary) shrinking step 370 are repeated iteratively until there are a sufficient number of candidate metrology point locations from which to complete the measurement scheme. In an embodiment, steps 360 and 370 operate such that the number of candidate metrology point locations is maintained to be similar or approximately the same for each iteration of the algorithm. For example, these steps may result in the number of candidate metrology point locations varying by no more than 30%, no more than 20%, no more than 10%, no more than 5%, no more than 2% or no more than 1%.

When there are a sufficient number of candidate metrology point locations, the evaluation step 310 is repeated and another iteration of the measurement scheme optimization algorithm (steps 310 to 370) is begun.

A criterion used in the evaluation step 310 may be D-optimality. In D-optimal designs, the determinant of the information matrix is maximized (and hence the determinant of the variance covariance matrix is minimized). An example for illustration is provided below.

Assuming a linear model, that is a model which is linear in its parameters, the following equation can be written:

$$\begin{bmatrix} m_1 \\ m_2 \\ \vdots \\ m_n \end{bmatrix} = \begin{bmatrix} C_{11} & C_{12} & \ldots & C_{1q} \\ C_{21} & C_{22} & \ldots & C_{2q} \\ \vdots & \vdots & \ddots & \vdots \\ C_{n1} & C_{n2} & \ldots & C_{nq} \end{bmatrix} \cdot \begin{bmatrix} p_1 \\ p_2 \\ \vdots \\ p_q \end{bmatrix} + \begin{bmatrix} \xi_1 \\ \xi_2 \\ \vdots \\ \xi_n \end{bmatrix}$$

Measurements are denoted by m, parameters by p, residuals by $\xi$, and the so-called design matrix by C. This design matrix forms the heart of the model, and it is comprised of the basis functions evaluated at selected metrology locations where the respective measurements were taken. Using for example a one dimensional polynomial model in x of orders zero through four, the basis functions would simply be; 1, x, $x^2$, $x^3$ and $x^4$ respectively. Therefore, if a measurement were to be available for location x=3, not taking into account normalization, the corresponding row in C would be: [1 3 9 27 81].

The modeling process may then proceed as follows:
1. measurements at selected metrology point locations are (made) available;
2. a suitable model form (i.e. a set of basis functions) is chosen so as to capture the relevant information underlying the data;
3. a minimization is performed yielding parameter values which minimize the distance in some mathematical norm between the model and the measurement data, this minimization may take the form of a least squares modeling.

Keeping the same notation as in the above, the optimization problem solved in least squares estimation is as follows:

$$\min_p \|m - C \cdot p\|_2^2 = \min_p (p^T \cdot C^T \cdot C \cdot p - 2 \cdot p^T \cdot C^T \cdot m) = \min_p \rho(p) \quad \text{Eq (1)}$$

Which in turn can be solved as follows:

$$\frac{\partial \rho}{\partial p^T} = 2 \cdot C^T \cdot C \cdot p - 2 \cdot C^T \cdot m \equiv 0 \to C^T \cdot C \cdot p = \quad \text{Eq (2)}$$

$$C^T \cdot m \to p = [C^T \cdot C]^{-1} \cdot C^T \cdot m$$

$C^T C$ is the information matrix, and its inverse $[C^T C]^{-1}$ is the variance-covariance matrix. The information matrix and variance-covariance matrix both indicate how informative the measurement scheme (i.e. the experiment) is for the chosen model; i.e., how well the measurement scheme will allow differentiation of the parameters (it should be noted that actual measurement values are not used for this). So, minimizing the determinant of the variance-covariance matrix or maximizing the determinant of the information matrix will yield the same result.

Figure 5:
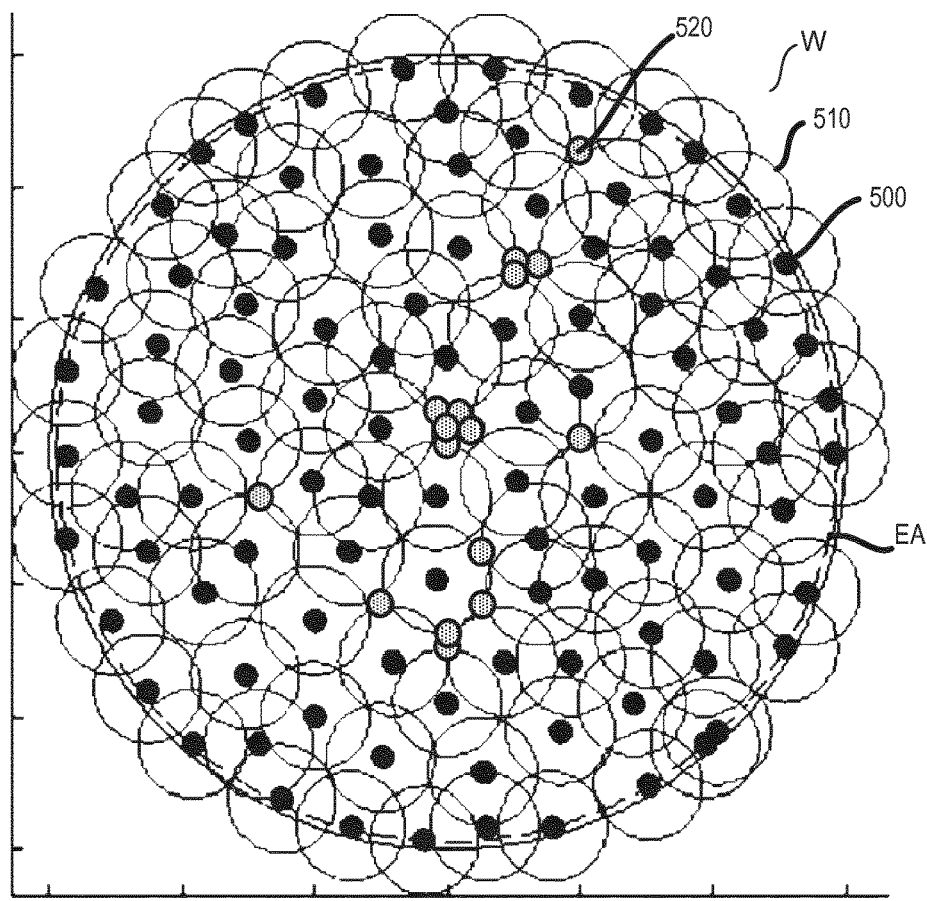
FIG. 5 a representation of a substrate following a number of iterations of the method illustrated in FIG. 3, according to an embodiment.

FIG. 5 is a drawing representing the effective area EA of substrate W following a number of iterations of the algorithm of FIG. 3. Selected metrology point locations 500 (black) are those which have been selected for the measurement scheme. Each of these selected metrology point locations 500 is surrounded by an exclusion zone 510. Candidate metrology point locations 520 (shaded) are those metrology point locations not within an exclusion zone 510 (and which have not yet been selected for the measurement scheme, as selected metrology point locations 500 will always be within an exclusion zone 510).

Figure 6:
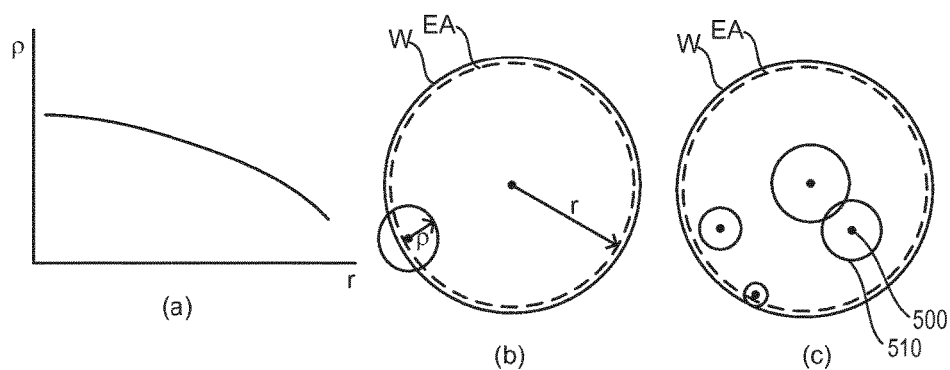
FIG. 6 shows (a) a graph illustrating an example relationship between the distance r that a metrology point is from the center of the effective area EA, and the radius of the exclusion zone ρ according to an embodiment; (b) a representation of a substrate indicating distance r and radius ρ and (c) a representation of a substrate illustrating the application of an exemplary position-dependent scaling factor to the exclusion zones.

It is also possible to apply a position-dependent scaling factor to the exclusion zones, as illustrated in FIG. 6. FIG. 6(a) illustrates an example relationship between the distance r that a metrology point location is from the center of the effective area EA, and the radius of the exclusion zone p. These parameters are shown on FIG. 6(b). Here a quadratic function is used for the scaling, but in principle other functions could be used. Furthermore, the scaling may depend on a position-dependent factor other than distance from the center. Consequently, emphasis can be put on a certain area (or areas) of the substrate. The specific example shown in FIG. 6(a) results in smaller exclusion zones 510 (smaller p) for those selected metrology point locations 500 which lie closer to the edge of the effective area EA, as illustrated in FIG. 6(c).

Figure 7:
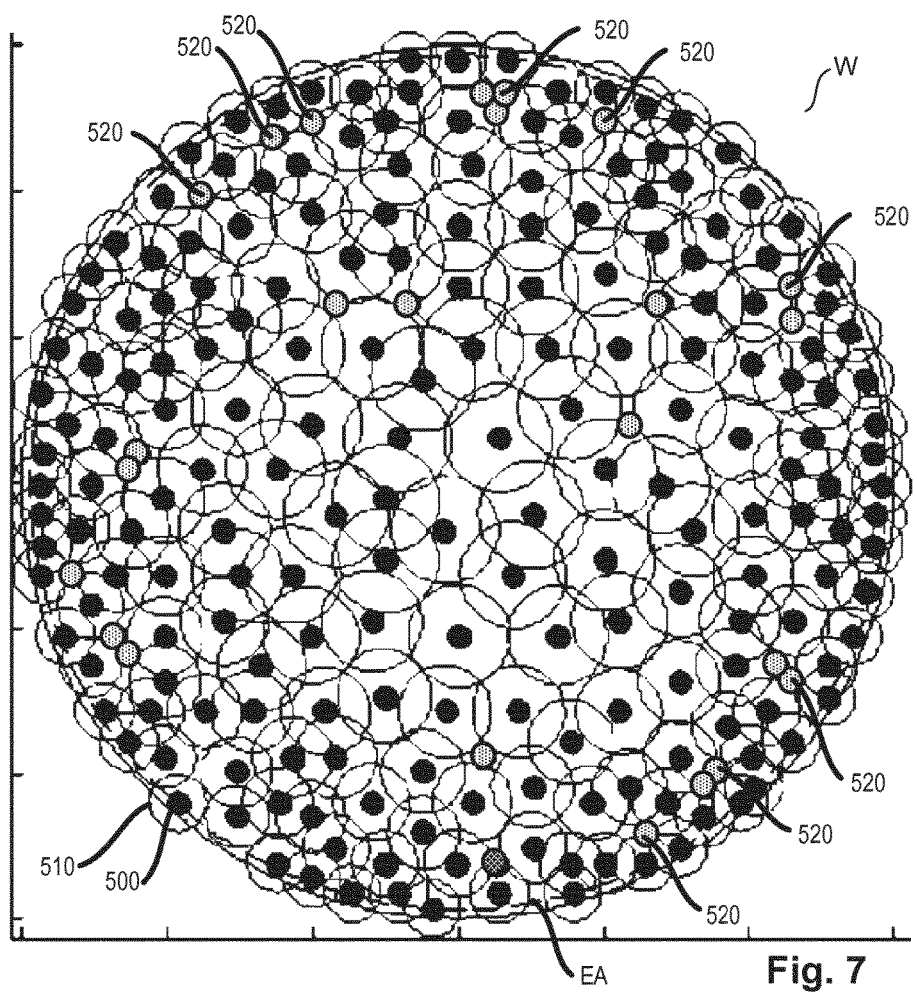
FIG. 7 a representation of a substrate following a number of iterations of the method illustrated in FIG. 3 and application of an exemplary position-dependent scaling factor to the exclusion zones.

FIG. 7 is a drawing representing the effective area EA of substrate W following a number of iterations of the algorithm of FIG. 3, as modified by the application of a position-dependent scaling factor to the exclusion zones as described in the preceding paragraph. As the exclusion zones 510 are smaller nearer the edge of the effective area EA, there are a greater number of selected metrology point locations 500 at the substrate's periphery, compared to nearer the center. As before, candidate metrology point locations 520 are those metrology point locations not within an exclusion zone 510 and which have not yet been selected for the measurement scheme. It can also be seen that there are more candidate metrology point locations 520 at the substrate's periphery, compared to nearer the center.

While the measurement scheme optimization methods described above distribute the selected metrology point locations with a sufficient degree of uniformity, they also result in a measurement scheme being determined once and for all for a given model and given reticle layout. The measurement scheme is static such that the measurement point locations are always the same for each substrate. This can be considered to be a lost opportunity, in that substrate-to-substrate effects cannot be captured and modelled with such a static measurement scheme. In fact, there may even be a risk associated in using a single, static measurement scheme for all substrates. Should there be a mechanism which generates a defect at the same location on each substrate, the sample scheme could cause the same defect to be measured multiple times.

Using different measurement schemes for different substrates can provide a better representation of the average substrate. This enables lot based corrections and can provide a good estimation of the process fingerprint for the average substrate per lot of substrates. Using different measurement schemes can also provide for a denser measurement scheme overall; information can be combined from all the measurement schemes and included in an estimation process such as described above with regard to Equations (1) and (2). Both matrices C and m can be comprised of data from multiple substrates, regardless of whether the same measurement scheme is used for all substrates or if the substrates all have different measurement schemes. This may be particularly relevant when there are many substrates to be measured per lot, and therefore fewer points can be measured per substrate. Where such sparse measurement schemes are required, measuring different points on different substrates within the lot becomes more desirable.

A number of different methods are proposed for determining different measurement schemes for different substrates. Simpler embodiments may include simply running the measurement scheme optimization algorithm illustrated in FIG. 3 for different substrates with one or more parameters changed, therefore resulting in a different measurement scheme being determined. The parameter change may relate to the initialization step 300, thereby changing one or more of the initial selected metrology point locations 400. Alternatively, or in addition, the parameter change may relate to a step after the initialization step 300. For example, the parameter change may relate to the size of the exclusion zones. The parameter change may include (for example) changing one or more of: the size of the exclusion zones when they are initially added, the degree by which the exclusion zones are shrunk at step 370, the position-dependent scaling factor for the exclusion zones, and any criterion on which the evaluation at step 310 is made.

While there should be some improvement in providing different but otherwise largely unconnected measurement schemes for different substrates, further improvement will be obtained by connecting the different measurement schemes of different substrates such that the selected metrology point locations are distributed with a high degree of uniformity over a plurality of substrates: for example per lot of substrates. In particular, a measurement scheme optimization method may be such that a metrology point location which has been selected for a previous measurement scheme (for a previous substrate) is not selected for a subsequent measurement scheme (for a subsequent substrate) within a lot. In this way each selected metrology point location for the lot of substrates is unique.

Figure 8:
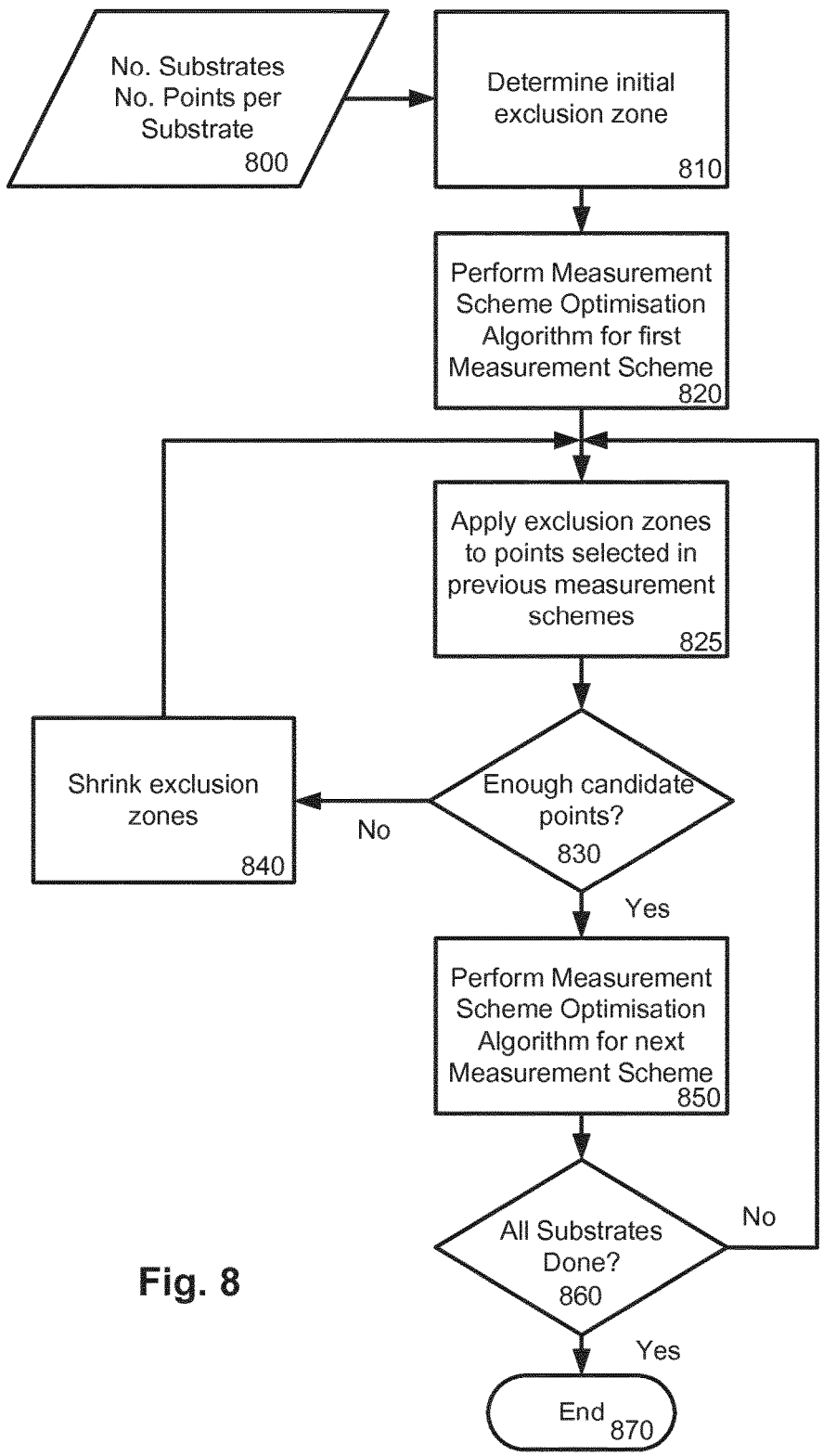
FIG. 8 is a flowchart illustrating a method according to a further embodiment of the invention.

FIG. 8 is a flowchart illustrating a method of determining a different measurement scheme for each substrate per lot of substrates while distributing the metrology point locations with a high degree of uniformity across the lot. At step 800, the number of substrates within a lot, and the number of metrology points to be included within each measurement scheme (i.e. per substrate) are used as input parameters for the method.

At step 810, initial exclusion zones are determined. The exclusion zones may take the same form and be used in a similar manner as the exclusion zones already described. Determining the initial exclusion zones at this step may comprise determining their size and optionally and any position-dependent scaling factor if being used. As with the initialization step 300 of the method of FIG. 3, the initial exclusion zones should be relatively large, and their size should be determined to ensure that the initial set of candidate metrology point locations is not too large.

At step 820, the measurement scheme optimization algorithm as disclosed herein and illustrated in FIG. 3 is performed for a first time to obtain a first measurement scheme for a first substrate of said lot of substrates. The algorithm performed at this step may include any of the optional variations and refinements described herein, such as the use of position-dependent scaling factor for the exclusion zones.

At step 825, the exclusion zones determined at step 810 are applied to the selected metrology point locations of the first measurement scheme, such that each of these selected metrology point locations has surrounding it an exclusion zone. All metrology point locations which are outside of the exclusion zones will be candidate metrology point locations at the beginning of the next iteration of this method, for determining the next measurement scheme for the next substrate. As before, the exclusion zones may be circular and centered on each selected metrology point location, i.e., all metrology point locations within a certain distance of a selected metrology point location may be within an exclusion zone. In this manner, metrology points selected for one measurement scheme will not be selected for future measurement schemes for substrates within the same lot.

At step 830, it is it is determined whether there are a sufficient number of candidate metrology point locations remaining for the algorithm to select from in the next iteration to determine the next measurement scheme, while maintaining the proper balance between informativity and uniformity. In an embodiment, if it is determined that there are too few candidate metrology point locations, this may be addressed at step 840 by shrinking the exclusion zones. All of the exclusion zones may be shrunk, or only a subset of these exclusion zones. It may be decided to only shrink some of the exclusion zones depending on various criteria. Such criteria may comprise the size of the exclusion zone or its position. The shrinking of the exclusion zones may be by a predetermined amount or by a predetermined percentage. the number of candidate metrology point locations is maintained to be similar or approximately the same for each iteration of the algorithm. In an embodiment, steps 830 and 840 operate such that the number of candidate metrology point locations is maintained to be similar or approximately the same for each iteration of the algorithm. For example, these steps may result in the number of candidate metrology point locations varying by no more than 30%, no more than 20%, no more than 10%, no more than 5%, no more than 2% or no more than 1%.

At step 850, once it has been determined that there are sufficient candidate points, the measurement scheme optimization algorithm as disclosed herein and illustrated in FIG. 3 is performed again to obtain the next measurement scheme for the next substrate of said lot of substrates.

At step 860, it is determined whether measurement schemes have been determined for all substrates within a lot. If so, the algorithm ends 870. If not, the algorithm repeats iterations of steps 825 to 860. For each subsequent iteration after the first, step 825 applies exclusion zones to all of the metrology point locations that have been selected in all previous iterations, that is all metrology point locations that have been selected for each of the previous measurement schemes determined in previous iterations.

Figure 9:
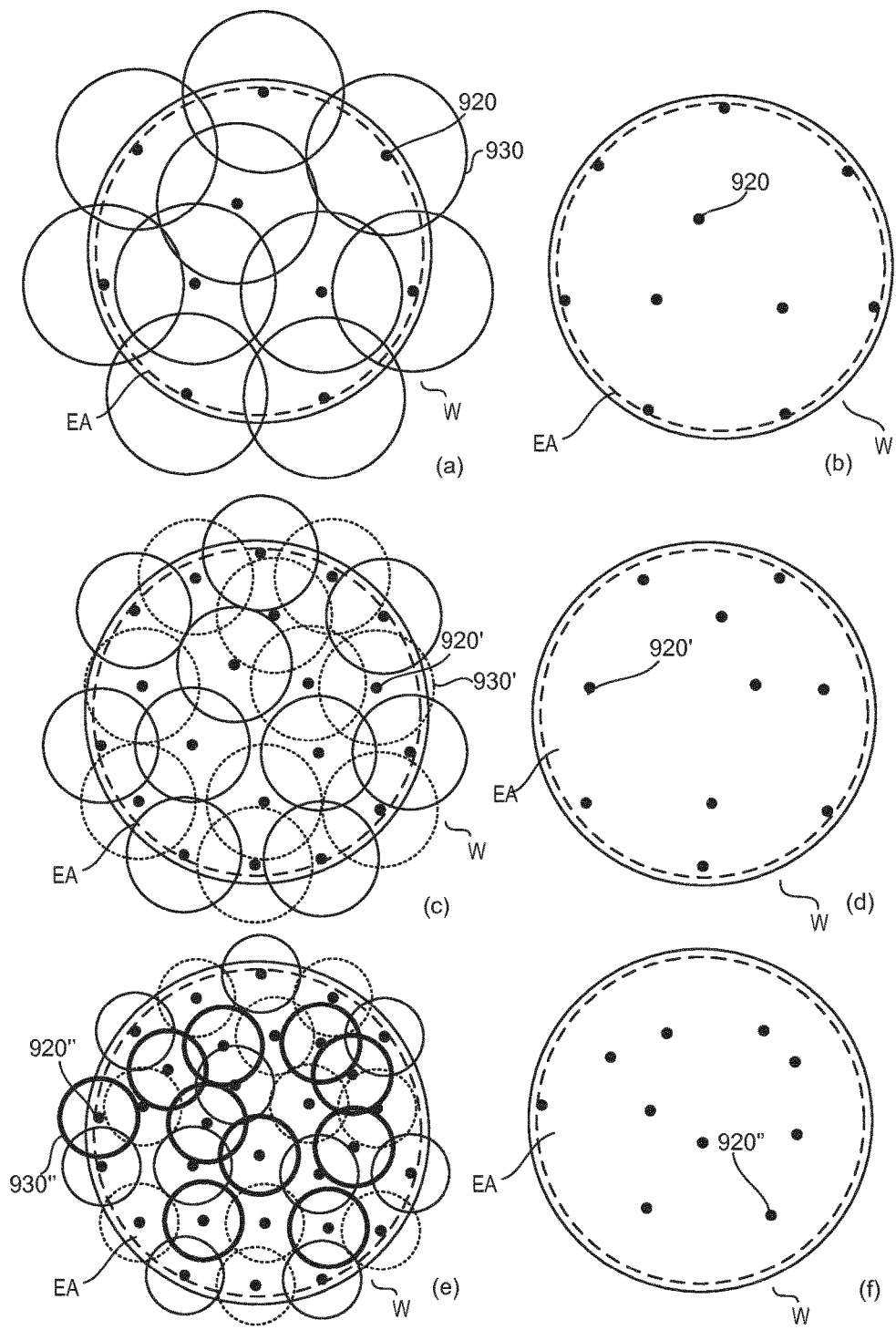
FIG. 9 is a representation of a substrate following (a) a first iteration and (b) the resultant first measurement scheme, (c) a second iteration and (d) the resultant second measurement scheme, and (e) a third iteration and (f) the resultant third measurement scheme, of the method illustrated in FIG. 8.
Figure 10:
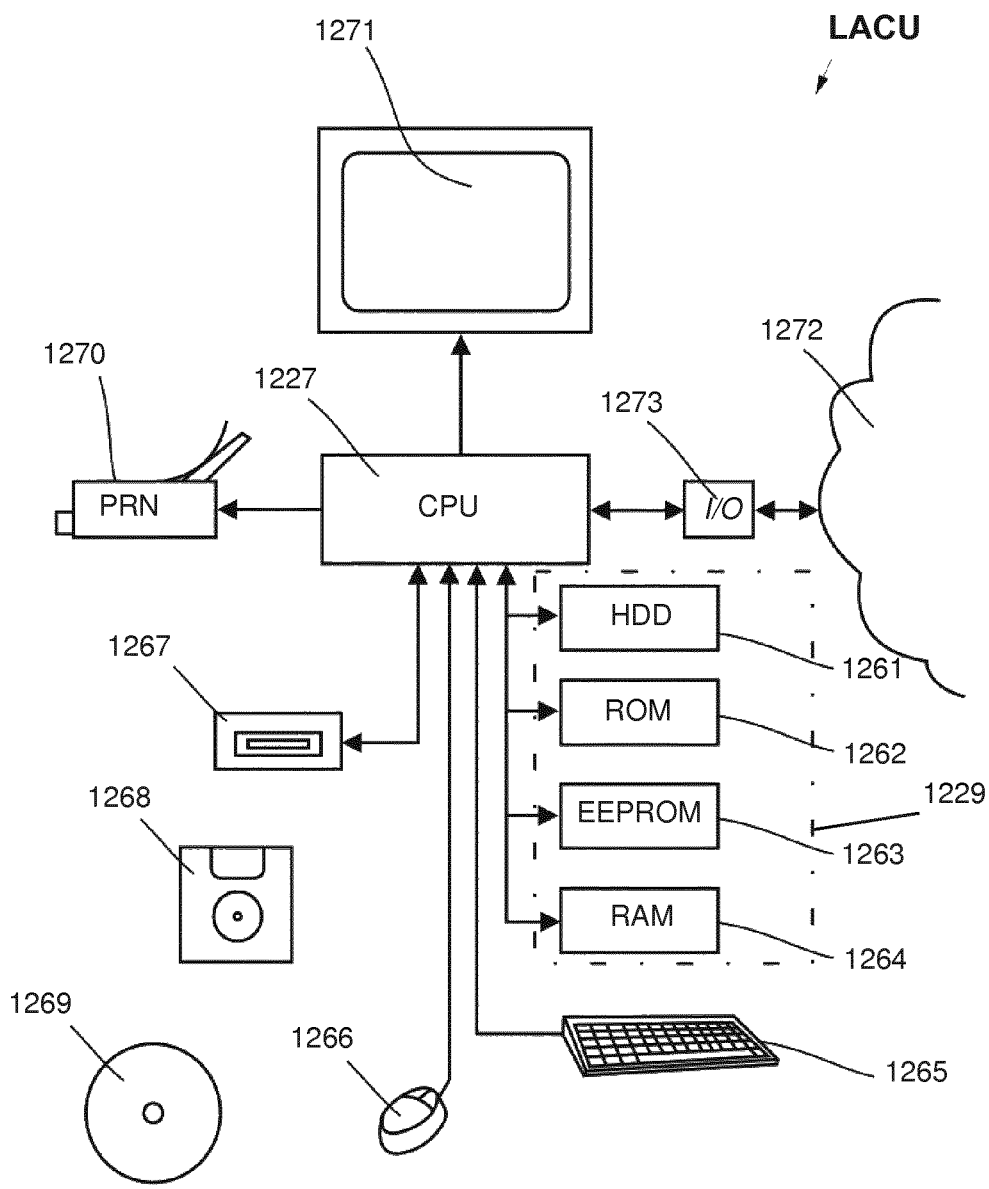
FIG. 10 illustrates computer system hardware useful in implementing the processes disclosed herein.

FIG. 9 illustrates three iterations of the method illustrated in FIG. 8. In this example, each measurement scheme comprises 10 metrology point locations. Each of the FIGS. 9(a) to 9(f) shows a substrate W with effective area EA. FIG. 9(a) shows a first measurement scheme being determined, comprising 10 selected metrology point locations 920, each surrounded by an exclusion zone 930. FIG. 9(b) shows the selected metrology point locations 920 of the first measurement scheme as determined by the first iteration. FIG. 9(c) shows the second iteration of the method illustrated in FIG. 8. Selected metrology point locations of the first iteration are shown with exclusion zones 930' defined by a solid line, while those of the second iteration are shown with exclusion zones 930' defined by a dotted line. Prior to the selection of selected metrology point locations of the second iteration 920', the exclusion zones 930' are shrunk to ensure sufficient candidate points were available for the selection. FIG. 9(*d*) shows the 10 selected measurement scheme locations of the second measurement scheme 920'. FIG. 9(*e*) shows the third iteration illustrated in FIG. 8. In this Figure, the selected metrology point locations of the third iteration are shown with exclusion zones 930" defined by a bold solid line, with those of the first and second iteration being represented similarly as in FIG. 9(*c*). Once again, prior to the selection of selected metrology point locations 920" of the third iteration, the exclusion zones 930" are shrunk to ensure sufficient candidate points were available for the selection. FIG. 9(*f*) shows the 10 selected measurement scheme locations 920" of the third measurement scheme.

Some of the steps of the measurement scheme optimization algorithm may differ to that described above in relation to FIG. 3, when being iteratively used, as in this embodiment. For example, the initialization step 300, for iterations after the first iteration, may have to differ from that described, as it may no longer be possible to select initial metrology point locations at the periphery of the effective area of the substrate and separated equiangularly. It may be that the initialization step 300 is dispensed with altogether after the first iteration, or else a different initialization strategy may be implemented. Similarly, the query step 360 and shrinking step 370, which act together to shrink the exclusion zones if there are insufficient candidate points, can optionally be dispensed with. This is because steps 830 and 840 determine whether there are sufficient candidate points for the next iteration and shrinks the exclusion zones if there is not. However these steps would be retained for the "substrate exclusion zones" in the variation described in the next paragraph.

In a variation on the method of FIG. 8, the exclusion zones determined at step 810, applied at step 825 and shrunk at step 840 (hereafter lot exclusion zones) may be different to the exclusion zones of the measurement scheme optimization algorithm, specifically those applied at steps 300 and 350, and shrunk at step 370 (hereafter substrate exclusion zones). By this variation, the substrate exclusion zones can be larger than the lot exclusion zones. This can help ensure a more uniform distribution of selected metrology point locations for each measurement scheme, while still ensuring a uniform distribution for all the selected metrology point locations for the whole lot of substrates. The lot exclusion zones may be provided with the same or similar refinements as disclosed in relation to the substrate exclusion zones, for example a position-dependent scaling factor.

As an alternative to the method illustrated in FIG. 8, a single iteration of the optimization algorithm of FIG. 3 can be run which determines all of the metrology point locations for the lot of substrates. These determined metrology point locations can be distributed into individual measurement schemes. This algorithm may run in a similar manner as if all the metrology point locations of the lot were to be included in a single measurement scheme. However, in one embodiment, measurement schemes are output periodically, depending on the number of metrology point locations which are to be selected per measurement scheme. For example, if this algorithm was to be run for a lot of 10 substrates, each to comprise 10 selected metrology point locations, the algorithm would be run to select 100 metrology point locations, with a different measurement scheme output after every 10 metrology point locations are selected. In this embodiment the algorithm may be such that the initial metrology point locations selected during the initialization step 300, which may comprise equi-angularly distributed metrology point locations at the periphery of the effective area of the substrate, may then be distributed among all the substrates instead of only the first. This would help prevent the periphery of the substrate being more densely sampled on the first substrate compared to all other substrates per lot.

While it is envisaged that the measurement schemes determined for each substrate of a lot will all comprise the same number of selected metrology point locations, this is not strictly necessary. Variations of the multiple substrate embodiments described above may set only a number of metrology points to be selected per lot, with some variation allowed in the number of selected metrology point locations in a particular measurement scheme.

The methods disclosed herein help ensure that, for each individual substrate, the normalized model uncertainty is minimized: all parameter values can be determined with improved precision. It does this by minimizing the impact that variations in the measurements have on variations in the model predictions.

It should be appreciated that while the above description is couched in terms of overlay and alignment, it is not so restricted. The methods disclosed herein can be used in metrology of any type of feature which can be measured/modeled (e.g., Critical Dimension, Focus, Side Wall Angle, etc.). The more expensive the metrology, the greater the added value of an intelligent measurement scheme of reduced size.

In an embodiment, there is provided a method of determining a measurement subset of metrology point locations, the measurement subset comprising a subset of potential metrology point locations on a substrate, and the method comprising: identifying a plurality of candidate metrology point locations from the potential metrology point locations; evaluating for each of the candidate metrology point locations, a change in the level of informativity imparted by the measurement subset of metrology point locations which is attributable to the inclusion of that candidate metrology point location into the measurement subset of metrology point locations; and selecting for inclusion into the measurement subset of metrology point locations, those candidate metrology point locations which have the greatest increase in the level of informativity attributed thereto.

In an embodiment, the criterion used to evaluate the change in the level of informativity is D-optimality. In an embodiment, the measurement subset of metrology point locations are used to model the substrate according to a modelling scheme, and the method further comprises, for each of the candidate metrology point locations, maximizing the determinant of a design matrix describing the modelling scheme having the candidate metrology point location, or minimizing the determinant of the variance-covariance matrix corresponding to the design matrix. In an embodiment, the method comprises an initialization step wherein an initialization subset of the potential metrology point locations are pre-selected for inclusion into the measurement subset of metrology point locations. In an embodiment, the initialization subset comprises metrology point locations spaced substantially equiangularly on the periphery of the substrate. In an embodiment, an exclusion zone is defined in the vicinity of each of the metrology point locations selected for inclusion into the measurement subset of metrology point locations, and the candidate metrology point locations comprise only potential metrology point locations located outside of these exclusion zones. In an embodiment, the candidate metrology point locations comprise all of the potential metrology point locations not within an exclusion zone. In an embodiment, there is a requirement that the measurement subset of metrology point locations comprises a predetermined number of metrology point locations distributed on the substrate, and the method further comprises: determining whether there are sufficient candidate metrology point locations to meet the requirement; and where there are insufficient candidate metrology point locations to meet the requirement, decreasing the area of some or all of the exclusion zones. In an embodiment, the requirement is that the measurement subset of metrology point locations comprises a predetermined number of metrology point locations distributed on the substrate with a predetermined uniformity. In an embodiment, each exclusion zone is substantially circular and centered on its corresponding selected metrology point location. In an embodiment, the area of each exclusion zone varies in accordance with the position of the corresponding selected metrology point location on the substrate. In an embodiment, the area of each exclusion zone tends to increase the nearer that its corresponding selected metrology point location is to the center of the substrate. In an embodiment, the method is performed iteratively such that in each iteration, the selecting a candidate metrology point location for inclusion into the measurement subset of metrology point locations comprises selecting a single candidate metrology point location which has the greatest increase in the level of informativity attributed thereto in that iteration, the method being repeated until a sufficient number of metrology point locations are selected. In an embodiment, a plurality of measurement subsets of metrology point locations are determined, one for each substrate of a plurality of substrates. In an embodiment, each metrology point location which has been selected for inclusion in one of the plurality of measurement subsets of metrology point locations cannot be selected for a subsequent one of the plurality of measurement subsets of metrology point locations. In an embodiment, an exclusion zone is defined in the vicinity of each of the metrology point locations selected for inclusion into one of the plurality of measurement subsets of metrology point locations, and the candidate metrology point locations for each substrate of the plurality of substrates comprise only potential metrology point locations located outside of these exclusion zones. In an embodiment, the method is performed iteratively such that one of the plurality of measurement subsets of metrology point locations is determined in each iteration, the method being repeated until a measurement subset of metrology point locations has been determined for each of the plurality of substrates. In an embodiment, between each iteration during which one of the plurality of measurement subsets of metrology point locations is determined, it is determined whether there are sufficient candidate metrology point locations from which to select a measurement subset of metrology point locations in a next iteration; and if the number of candidate metrology point locations is insufficient, decreasing the area of some or all of the exclusion zones. In an embodiment, for each iteration after the first, the exclusion zones comprise: lot exclusion zones which are defined for each metrology point location that has been selected for inclusion in one of the plurality of measurement subsets as determined in previous iterations; and substrate exclusion zones which are defined for each metrology point location that has been selected for inclusion in the measurement subset being determined in the present iteration. In an embodiment, the method comprises selecting all of the metrology point locations to be included within the plurality of measurement subsets of metrology point locations in a single iteration, the selected metrology point locations being distributed into individual measurement subsets of metrology point locations for individual substrates. In an embodiment, individual measurement subsets of metrology point locations for individual substrates comprise sets of consecutively selected metrology point locations during the single iteration. In an embodiment, the method comprises an initial step of obtaining a list of the potential metrology point locations. In an embodiment, the method further comprises performing a metrology operation on the substrate using measurements obtained exclusively from metrology points located at the measurement subset of metrology point locations, during a lithographic process. In an embodiment, the method further comprises performing an alignment operation on the substrate using measurements obtained exclusively from metrology points located at the measurement subset of metrology point locations, during a lithographic process. In an embodiment, the method further comprises modelling the shape of the substrate using measurements obtained exclusively from metrology points located at the measurement subset of metrology point locations, during a lithographic process.

In an embodiment, there is provided a computer program comprising computer readable instructions which, when run on suitable computer apparatus, cause the computer apparatus to perform a method as described herein.

In an embodiment, there is provided a computer program product comprising a computer program as described herein.

In an embodiment, there is provided apparatus specifically adapted to carry out the steps of the method as described herein. In an embodiment, the apparatus is specifically configured as a lithographic apparatus operable to perform a lithographic process on the substrate.

Implementation

The steps of the methods described above can be automated within the lithography apparatus control unit LACU shown in FIG. 1. This unit LACU may include a computer assembly as shown in FIG. 8. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 1229 connected to processor 1227 may comprise a number of memory components like a hard disk 1261, Read Only Memory (ROM) 1262, Electrically Erasable Programmable Read Only Memory (EEPROM) 1263 en Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Connections between modules can be made wired or wireless.

The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "field"/"die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The invention claimed is:

1. A method of determining a measurement subset of metrology point locations, the measurement subset comprising a subset of potential metrology point locations on a substrate, and the method comprising:
   identifying a plurality of candidate metrology point locations from the potential metrology point locations;
   evaluating for each of the candidate metrology point locations, a change in the level of informativity imparted by the measurement subset of metrology point locations which is attributable to the inclusion of that candidate metrology point location into the measurement subset of metrology point locations; and
   selecting for inclusion into the measurement subset of metrology point locations, those one or more candidate metrology point locations which have the greatest increase in the level of informativity attributed thereto,
   wherein an exclusion zone is defined in the vicinity of each of the metrology point locations selected for inclusion into the measurement subset of metrology point locations, and the candidate metrology point locations comprise only potential metrology point locations located outside of these exclusion zones.

2. A method as claimed in claim 1, wherein the criterion used to evaluate the change in the level of informativity is D-optimality.

3. A method as claimed in claim 2, wherein the measurement subset of metrology point locations are used to model the substrate according to a modelling scheme, and the method further comprises, for each of the candidate metrology point locations, maximizing the determinant of a design matrix describing the modelling scheme having the candidate metrology point location, or minimizing the determinant of the variance-covariance matrix corresponding to the design matrix.

4. A method as claimed in claim 1, wherein the candidate metrology point locations comprise all of the potential metrology point locations not within an exclusion zone.

5. A method as claimed in claim 1, wherein there is a requirement that the measurement subset of metrology point locations comprises a predetermined number of metrology point locations distributed on the substrate, and the method further comprises:

determining whether there are sufficient candidate metrology point locations to meet the requirement; and where there are insufficient candidate metrology point locations to meet the requirement, decreasing the area of some or all of the exclusion zones.

6. A method as claimed in claim 5, wherein the requirement is that the measurement subset of metrology point locations comprises a predetermined number of metrology point locations distributed on the substrate with a predetermined uniformity.

7. A method as claimed in claim 1, wherein each exclusion zone is substantially circular and centered on its corresponding selected metrology point location.

8. A method as claimed in claim 1, wherein the area of each exclusion zone varies in accordance with the position of the corresponding selected metrology point location on the substrate.

9. A method as claimed in claim 1, wherein a plurality of measurement subsets of metrology point locations are determined, one for each substrate of a plurality of substrates.

10. A method as claimed in claim 9, wherein each metrology point location which has been selected for inclusion in one of the plurality of measurement subsets of metrology point locations cannot be selected for a subsequent one of the plurality of measurement subsets of metrology point locations.

11. A method as claimed in claim 10, wherein an exclusion zone is defined in the vicinity of each of the metrology point locations selected for inclusion into one of the plurality of measurement subsets of metrology point locations, and wherein the candidate metrology point locations for each substrate of the plurality of substrates comprise only potential metrology point locations located outside of these exclusion zones.

12. A method as claimed in claim 11, wherein the method is performed iteratively such that one of the plurality of measurement subsets of metrology point locations is determined in each iteration, the method being repeated until a measurement subset of metrology point locations has been determined for each of the plurality of substrates.

13. A method as claimed in claim 12, wherein, between each iteration during which one of the plurality of measurement subsets of metrology point locations is determined, it is determined whether there are sufficient candidate metrology point locations from which to select a measurement subset of metrology point locations in a next iteration; and if the number of candidate metrology point locations is insufficient, decreasing the area of some or all of the exclusion zones.

14. A method as claimed in claim 12, wherein for each iteration after the first, the exclusion zones comprise:

lot exclusion zones which are defined for each metrology point location that has been selected for inclusion in one of the plurality of measurement subsets as determined in previous iterations; and substrate exclusion zones which are defined for each metrology point location that has been selected for inclusion in the measurement subset being determined in the present iteration.

15. A method as claimed in claim 1, further comprising performing a metrology operation on the substrate using measurements obtained exclusively from metrology points located at the measurement subset of metrology point locations, during a lithographic process.

16. A method as claimed in claim 1, further comprising modelling the shape of the substrate using measurements obtained exclusively from metrology points located at the measurement subset of metrology point locations, during a lithographic process.

17. A non-transitory computer program product comprising computer readable instructions which, when run on suitable computer apparatus, cause the computer apparatus to:

identify a plurality of candidate metrology point locations from potential metrology point locations on a substrate, the potential metrology points being a subset of metrology point locations from a measurement subset of metrology point locations;

evaluate for each of the candidate metrology point locations, a change in the level of informativity imparted by the measurement subset of metrology point locations which is attributable to the inclusion of that candidate metrology point location into the measurement subset of metrology point locations; and select for inclusion into the measurement subset of metrology point locations, those one or more candidate metrology point locations which have the greatest increase in the level of informativity attributed thereto, wherein an exclusion zone is defined in the vicinity of each of the metrology point locations selected for inclusion into the measurement subset of metrology point locations, and the candidate metrology point locations comprise only potential metrology point locations located outside of these exclusion zones.

18. The computer program product of claim 17, wherein a plurality of measurement subsets of metrology point locations are determined, one for each substrate of a plurality of substrates.

19. A method of determining a measurement subset of metrology point locations, the measurement subset comprising a subset of potential metrology point locations on a substrate, and the method comprising:

identifying a plurality of candidate metrology point locations from the potential metrology point locations;

evaluating for each of the candidate metrology point locations, a change in the level of informativity imparted by the measurement subset of metrology point locations which is attributable to the inclusion of that candidate metrology point location into the measurement subset of metrology point locations; and selecting for inclusion into the measurement subset of metrology point locations, those candidate metrology point locations which have the greatest increase in the level of informativity attributed thereto, wherein a plurality of measurement subsets of metrology point locations are determined, one for each substrate of a plurality of substrates.

20. The method of claim 19, wherein each metrology point location which has been selected for inclusion in one of the plurality of measurement subsets of metrology point locations cannot be selected for a subsequent one of the plurality of measurement subsets of metrology point locations.

* * * * *